United States Patent
Shaghgamyan

(10) Patent No.: US 11,229,122 B2
(45) Date of Patent: Jan. 18, 2022

(54) INCREASING EXPOSURE OF INTEGRATED CIRCUIT COMPONENTS

(71) Applicant: PHYSIGHT SOLUTIONS LLC, Nesconset, NY (US)

(72) Inventor: Davit Shaghgamyan, Dix Hills, NY (US)

(73) Assignee: PHYSIGHT SOLUTIONS LLC, Nesconset, NY (US)

( * ) Notice: Subject to any disclaimer, the term of this patent is extended or adjusted under 35 U.S.C. 154(b) by 0 days.

(21) Appl. No.: 17/062,576

(22) Filed: Oct. 3, 2020

(65) Prior Publication Data

US 2021/0105899 A1 Apr. 8, 2021

Related U.S. Application Data

(60) Provisional application No. 62/910,464, filed on Oct. 4, 2019.

(51) Int. Cl.
*H05K 1/18* (2006.01)
(52) U.S. Cl.
CPC ... *H05K 1/189* (2013.01); *H05K 2201/10053* (2013.01); *H05K 2201/10083* (2013.01); *H05K 2201/10098* (2013.01); *H05K 2201/10151* (2013.01)

(58) Field of Classification Search
CPC .......... H05K 1/186; H05K 1/189; H05K 2201/10053; H05K 1/10098; H05K 1/10151; H05K 1/10083; H05K 1/09063
See application file for complete search history.

(56) References Cited

U.S. PATENT DOCUMENTS

| | | | | |
|---|---|---|---|---|
| 6,449,168 | B1* | 9/2002 | Soderholm | H01L 23/10 257/E23.193 |
| 8,872,041 | B2* | 10/2014 | Lee | H05K 3/462 174/260 |
| 8,879,276 | B2* | 11/2014 | Wang | H05K 1/165 361/761 |
| 2008/0239192 | A1* | 10/2008 | Oohira | H05K 1/181 349/58 |
| 2018/0375541 | A1* | 12/2018 | Yoo | A45C 11/00 |
| 2019/0104237 | A1* | 4/2019 | Sugiyama | H04N 5/2253 |

* cited by examiner

*Primary Examiner* — Hoa C Nguyen
(74) *Attorney, Agent, or Firm* — Arluys IP, P.C.

(57) ABSTRACT

Techniques are described for an electronic device to increase the exposure of the externally bound components, such as sensors and antennas, which performance is improved by such exposure. A flexible printed circuit board (PCB) is affixed to the top surface of the device's enclosure, thereby placing the flexible PCB outside of the enclosure. Externally bound component(s) are integrated onto the flexible PCB, which has multiple layers, including an interface layer and a spacer layer. The spacer layer has an aperture extending through the layer at the locations corresponding to the externally bound components, thereby exposing the externally bound component's surface.

10 Claims, 7 Drawing Sheets

INCREASING EXPOSURE OF INTEGRATED CIRCUIT COMPONENTS

BENEFIT CLAIM

This application claims the benefit under 35 U.S.C. § 119(e) of provisional application 62/910,464, filed Oct. 4, 2019, the entire contents of which is hereby incorporated by reference for all purposes as if fully set forth herein.

FIELD OF THE TECHNOLOGY

The present invention relates to the field of electronic devices, in particular to device enclosure enhancement for increasing the exposure of integrated circuit component(s) to the environment in which the device is operating. More particularly, the invention relates to enabling integrated circuit components, such as sensor(s) and antenna(s), to be positioned on the external surface of the enclosure while providing electrical coupling of the components to the main circuit board inside the device enclosure.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Sensors are crucial to today's electronic devices. Sensor technologies have been rapidly evolving by increasing chip-level integration and thereby lowering cost and power. Availability of low profile (less than a few millimeters high) sensors that come in small packages and are compatible with industry-standard printed circuit board (PCB) assembly technologies have positively impacted the adoption of such sensors in the electronic devices.

Apart from sensors, electronic devices comprise of various additional components, including but not limited to micro-controller units (MCU), wireless modules, antennas, converters, battery charging subsystems, voltage regulators, actuators, relays, active and passive electrical components assembled on one or more printed circuit boards (PCB) and placed into the enclosure of the device.

Very often, sensors that are placed inside the enclosure are required to detect or measure a physical property of the environment where the device is placed, thus requiring a direct exposure of the sensors to the environment external to the device. For example, if the device is intended to measure temperature and humidity of the premises and if the respective sensor(s) are located internal to the device enclosure, then there would be an inherent error in the measurement caused by the significant difference between the temperature and humidity values internal to the enclosure compared to the external ones.

Usually, the presence of additional components on the PCB generates heat that will inadvertently change the sensor's temperature reading. Furthermore, the air within the enclosure might feature substantially different humidity levels than the air external to the enclosure, thus deteriorating the accuracy of humidity measurement. One method used to combat the aforementioned issues is creating extra holes in the enclosure for better airflow. However, the practice shows that such a method is not eliminating the problem and creates additional aesthetic issues related to the device's look and feel. Another approach may be to algorithmically auto-correct the reading of the sensor. For example, the sensor reading may be adjusted by a particular value to reflect the difference between the internal and external conditions. However, the unpredictable changes to the conditions inside the enclosure may yield the adjustment inaccurate. For example, for temperature sensors, a spike in wireless activity may significantly heat-up the inside of the enclosure. Therefore, at that moment, the algorithmic adjustment of the temperature sensor reading will be inaccurate.

Other board-integrated components have a similar need for external exposure. For example, integrated antennas are often placed within the enclosure of a device, thereby significantly worsening the acquired or transmitted signal's signal strength. Accordingly, wireless communication with external systems significantly deteriorates. The problem is particularly exacerbated by IoT devices that have to be in an insulated environment, such as wall switches, due to their functionality.

Thus, new techniques are necessary to increase the exposure of integrated circuit components to the environment.

BRIEF DESCRIPTION OF THE DRAWINGS

In the drawings of certain embodiments in which like reference numerals refer to corresponding parts throughout the figures.

DETAILED DESCRIPTION

Figure 1B:
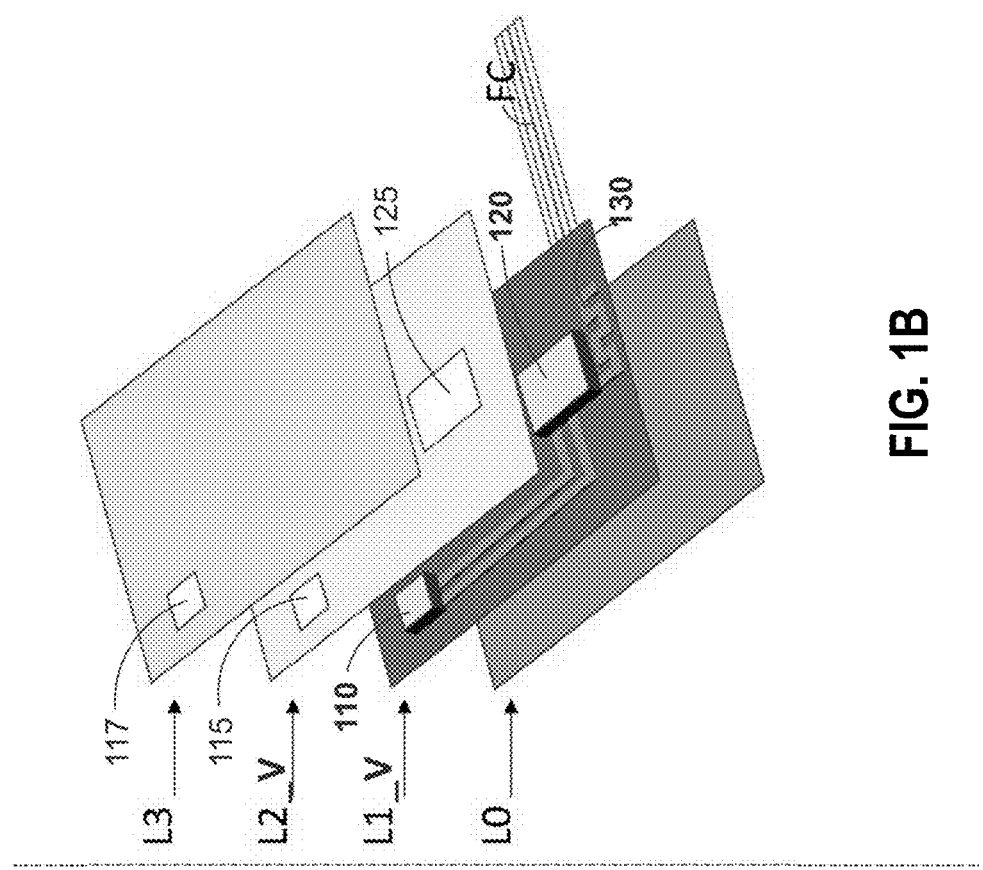
FIG. 1B is a block diagram that depicts a flexible PCB circuit with a single circuit layer and multiple externally bound components, in an embodiment.

In the following description, for the purposes of explanation, numerous specific details are set forth in order to provide a thorough understanding of the present invention. It will be apparent, however, that the present invention may be practiced without these specific details. In other instances, structures and devices are shown in block diagram form in order to avoid unnecessarily obscuring the present invention.

GENERAL OVERVIEW

The exposure of certain circuit component(s) to the environment external to the device enclosure improves the quality and accuracy of their performance. For example, increasing the environmental exposure of a circuit-integrated sensor improves sensing surfaces' effectiveness, which is critical for accurate detection or measurement of physical and other properties of the environment by the sensor. Similarly, increasing the environmental exposure of an integrated antenna improves its effectiveness by increasing the received and transmitted signal strength. The term "externally bound component" refers herein to an integrated circuit component that benefits from increased exposure to the environment external to the device enclosure.

The approaches herein describe an externally bound component, such as a sensor, integrated onto a flexible PCB circuit, which serves as an external surface of the device enclosure, thereby exposing the externally-bound component to the environment that is external to the enclosure. While maintaining the increased exposure of the externally-bound component(s) to the environment, the externally-bound components are electrically and communicatively coupled (e.g., soldered) onto one of the layers of the flexible PCB circuit.

Additionally, the device may include other circuit(s) besides the flexible PCB circuit. In such an embodiment, the flexible PCB circuit (including the externally-bound component(s)) may be electrically coupled to the other circuitry through a flexible cable originating from the flexible PCB, as an example. Accordingly, the other circuit may be placed within the enclosure while electrically coupled to the flexible PCB on the surface of the enclosure.

In an embodiment, the flexible PCB circuit may be a multi-layer circuit, which is stacked with multiple circuit and spacer horizontal layers to accommodate more externally-bound components. The top, overlay, layer of the flexible PCB layer may be the interface layer containing interface circuit components integrated onto it. For example, the top, interface, layer may additionally include electro-mechanical interfaces such as capacitive interfaces for touch-controlled switches/buttons. In an embodiment in which the device is a wall switch, a touch-controlled switch is integrated onto the flexible PCB circuit and controls the electrical load.

To accommodate different heights of the externally-bound components on the flexible PCB, a spacer layer is placed between the interface layer and the circuit layer that the integrated components are electrically coupled with. In one embodiment, the thickness of the spacer layer depends on the height(s) of the externally-bound component(s) to maximize the external exposure. In another embodiment, the thickness of the spacer layer is less than the height(s) of the externally-bound component(s) to ensure that the top surface area of the externally bound component is above the spacer layer and/or overlay layer thereby exposed to the external environment.

Such techniques provide a solution for increasing the exposure of externally-bound circuit components, such as sensors and antennas, to the external environment. The increased exposure improves the functionality of the integrated components while providing high quality, durable, and customizable interface surface for the enclosure of the device. For example, in the case of an integrated sensor, the sensor's measurement accuracy is improved. In the case of an integrated antenna, the antenna's radio signal transmission and reception are improved.

Externally-Bound Components on Flexible PCB

Figure 1A:
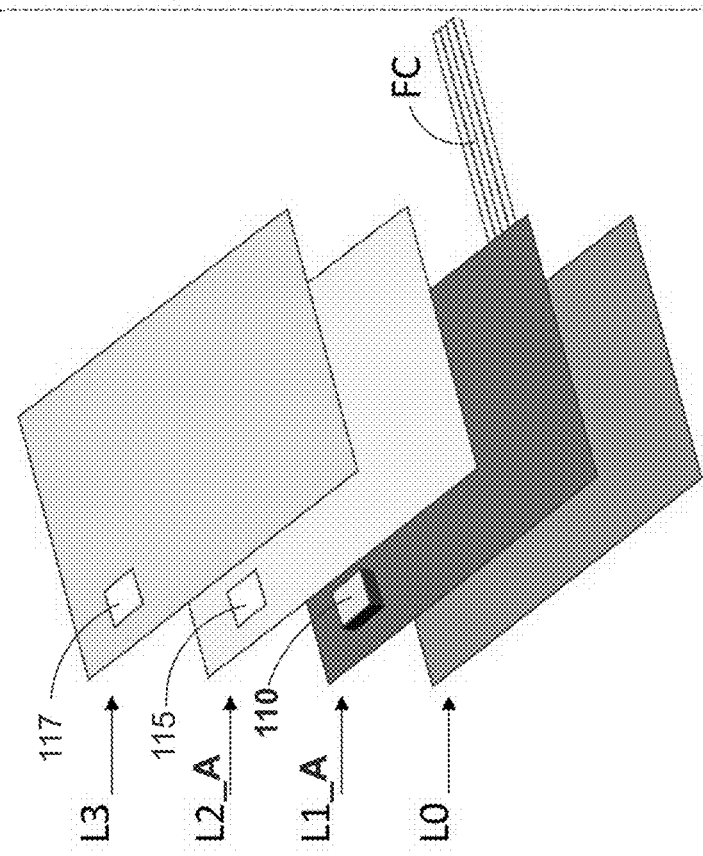
FIG. 1A is a block diagram that depicts a flexible PCB circuit with a single circuit layer, in an embodiment.

FIG. 1A is a block diagram that depicts a flexible PCB circuit with a single circuit layer, in an embodiment. Layer L0 is an adhesive layer that ensures the mechanical coupling of the flexible PCB circuit to the main body of the enclosure (not depicted). L1_A is a circuit layer that contains the circuit with integrated circuit components and routing, including the sensors, buttons, LEDs, etc. L2_A is a spacer layer which width/thickness is dependent on the highest externally bound component to maximally expose the surface of the component. Accordingly, the top surface of the externally bound component may maintain the smooth top surface of layers L2A or L3 and/or protrude from L3 layer. In the case of a sensor, such an arrangement exposes the sensing portion of the surface of the sensor to the environment. L3 is an interface, overlay, layer that may contain printed graphics. The layers above the circuit layer may contain one or more apertures at the locations where the externally-bound component is positioned in order to allow the exposure of the surface to the environment.

The flexible PCB circuit may include one or more externally bound components, such as externally bound component 110, on circuit layer L1_A in FIG. 1A. The L1 circuit layer may be attached at the top of the enclosure through intermediate adhesive layer L0, as depicted in FIG. 1A.

In an embodiment, the bottom side of adhesive layer L0 attaches to the enclosure that serves as the base for the flexible PCB. With such an attachment, layer L0 is directly on the surface of the enclosure of the device. The top side of the adhesive layer (which is not attached to the enclosure) attaches to the bottom side of circuit layer L1_A.

Accordingly, whether through adhesive layer L0 or otherwise, the circuit layer, such as layer L1_A, is outside the enclosure of the device. Externally bound components, such as component 110, are electrically coupled and attached to circuit layer L1_A, which may itself be connected to the circuitry internal to the enclosure of the device by cable FC. Accordingly, externally bound components are outside of the enclosure of the device yet electrically coupled with other integrated components of the device.

Spacer layer L2_A of FIG. 1A is selected to have at most the same width/thickness as the height of the top surface of externally bound component 110. In an embodiment, layer L2_A, using a spacer-based substance, generates a top surface that evenly covers the circuit layer L1_A. In an embodiment, in which multiple externally bound components are integrated into circuit layer L1_A, the externally bound component that protrudes the most (has the greatest height) from circuit layer L1_A is identified. Spacer layer L2_A has at most the width/thickness of the most protruding portion of the identified externally bound component.

In an embodiment to fully expose the surface of externally bound component 110, circuit layer L2_A has aperture 115 extending through the layer, at the location where externally bound component 110 is. Aperture 115 has an area of at least the area of the surface of externally bound component 110.

Spacer layer L2_A may be overlaid by interface layer L3 of FIG. 1A. Interface layer L3 (also referred to as overlay) provides high quality and durable surface for the enclosure of the device. Interface layer L3 may be printed with a wide range of colors or design patterns designed for the device and may comply with general aesthetic requirements.

In an embodiment, interface layer L3 has aperture 117 extending through the layer at the location where externally bound component 110 is. Aperture 117 has at least the area of the pertinent surface of externally bound component 110. The pertinent surface of externally bound component 110 may be a portion of the surface area of externally bound component 110. For example, for a sensor component, the pertinent area may be the sensing area of the component, which may be a portion of the surface area of the component. Thus, in some embodiment, aperture 117 may be less in the area than aperture 115.

In an embodiment, the flexible PCB circuit is connected to the main PCB circuit via a flexible cable, FC, in FIG. 1A. Cable FC may originate at the bottom side of circuit layer L1 and extend towards the inside of the enclosure.

FIG. 1B is a block diagram that depicts a flexible PCB circuit with a single circuit layer and multiple externally bound components, in an embodiment. In addition to externally bound component 110, circuit layer L1_V includes externally bound component 120. To fully expose the surface of externally bound component 110, circuit layer L2_V contains aperture 125 extending through the layer L2_V, at the location where externally bound component 120 is. Aperture 125 has an area of at least the area of the surface of externally bound component 120.

An externally bound component may not need to be fully exposed to the environment external to the device but rather have better performance due to the sheer fact of being placed outside of the enclosure, in an embodiment. Furthermore, esthetically, it may be preferable for the interface layer to have as few apertures as possible extending through the layer. Accordingly, in such an embodiment, the interface/overlay layer of the flexible PCB may not have an aperture for the externally bound component. In FIG. 1B, such an externally bound component, 120, fails to have any aperture extending through layer L3 at its location in circuit layer L1_V of the flexible PCB.

In an embodiment, an externally bound component may have significant performance benefit for being external to the enclosure of the device and there may not be materially significant improvement for further increasing the exposure. In such an embodiment, externally bound component may be integrated onto the circuit layer without any aperture in any of the above layers (spacer and interface). In FIG. 1B, externally bound component 130 is integrated within circuit layer L1_V without any further exposure to the external environment: no aperture in layer L2_V or L3.

For example, an antenna integrated on circuit layer L1_V may have significant performance gain by being outside of the enclosure of the device for which it receives and transmits signals. For the antenna component, an interface layer or even a spacer layer above may not substantially interfere with its performance. Therefore, no aperture may be placed on the interface layer, preserving the esthetics of the device.

The flexible PCB may have additional circuit layers and/or spacer layers to accommodate additional integrated circuit components and/or match the height of multiple externally bound components integrated on the flexible PCB with its surface. For example, when an externally bound component protrudes such that it is impossible to have a single spacer layer due to manufacturing constraints of flexible PCBs, additional circuit and spacer layer pairs may be added. Accordingly, any arbitrary height of the externally bound component may be satisfied by placing additional pairs of circuit and spacer layers with corresponding apertures extending through the layers. Similarly, when the necessary number of externally bound components cannot be integrated on a single circuit layer of a flexible PCB due to manufacturing constraints, an additional pair of circuit and spacer layers may be used to accommodate more externally bound components. In such an example, the circuit layers of the flexible PCB may be electrically coupled through vias that pass through the layer(s) that separate the circuit layers.

Figure 2:
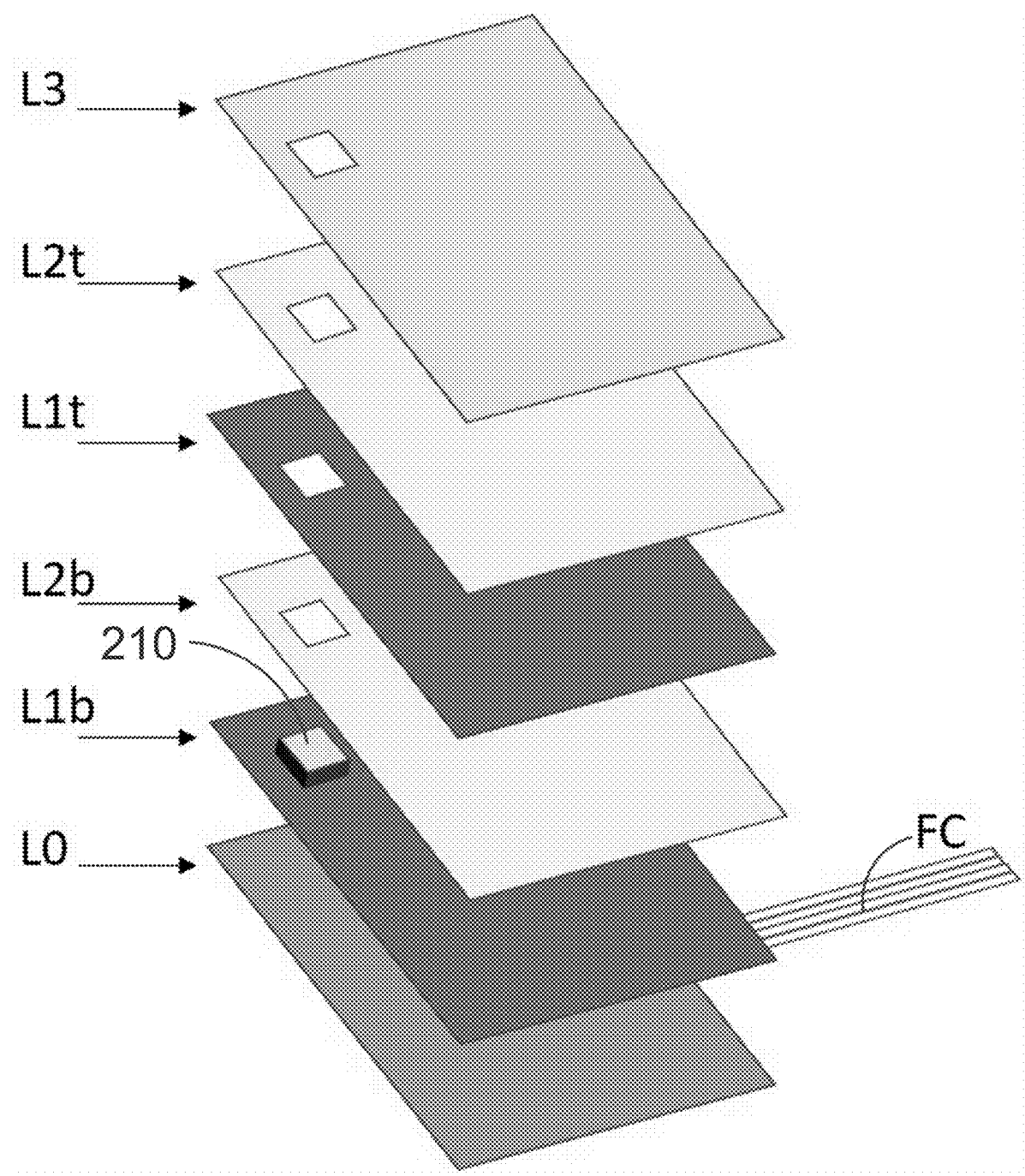
FIG. 2 is a block diagram that depicts a flexible PCB circuit with two circuit layers and two spacer layers, in an embodiment.

FIG. 2 is a block diagram that depicts a flexible PCB circuit with two circuit layers and two spacer layers, in an embodiment. Layers L1$b$ and L1$t$ are the bottom and the top circuit layers, respectively, each of which may contain one or more externally bound components, such as externally bound component 210. L2$b$ and L2$t$ are the bottoms and the top spacer layers, respectively, for layers L1$b$ and L1$t$. L3 is an overlay layer that may contain printed graphics. Since externally bound component 210 is integrated onto the bottom circuit layer, L1$b$, an aperture may be placed in each of the layers above of the flexible PCB, including layer L1$t$, which is another circuit layer.

With multiple pairings of circuit and spacer layers within a flexible PCB, the environmental exposure may be maximized for different heights of externally bound components. If only a single pair of layers is used, then the spacer layer thickness/width is determined based on an externally bound component with the greatest height. In such an example, an externally bound component with a lower height, which is integrated on the same circuit, does not reach the top surface of the spacer layer. Thus, the externally bound component with a lower height has worse performance due to the decreased exposure.

Figure 3A:
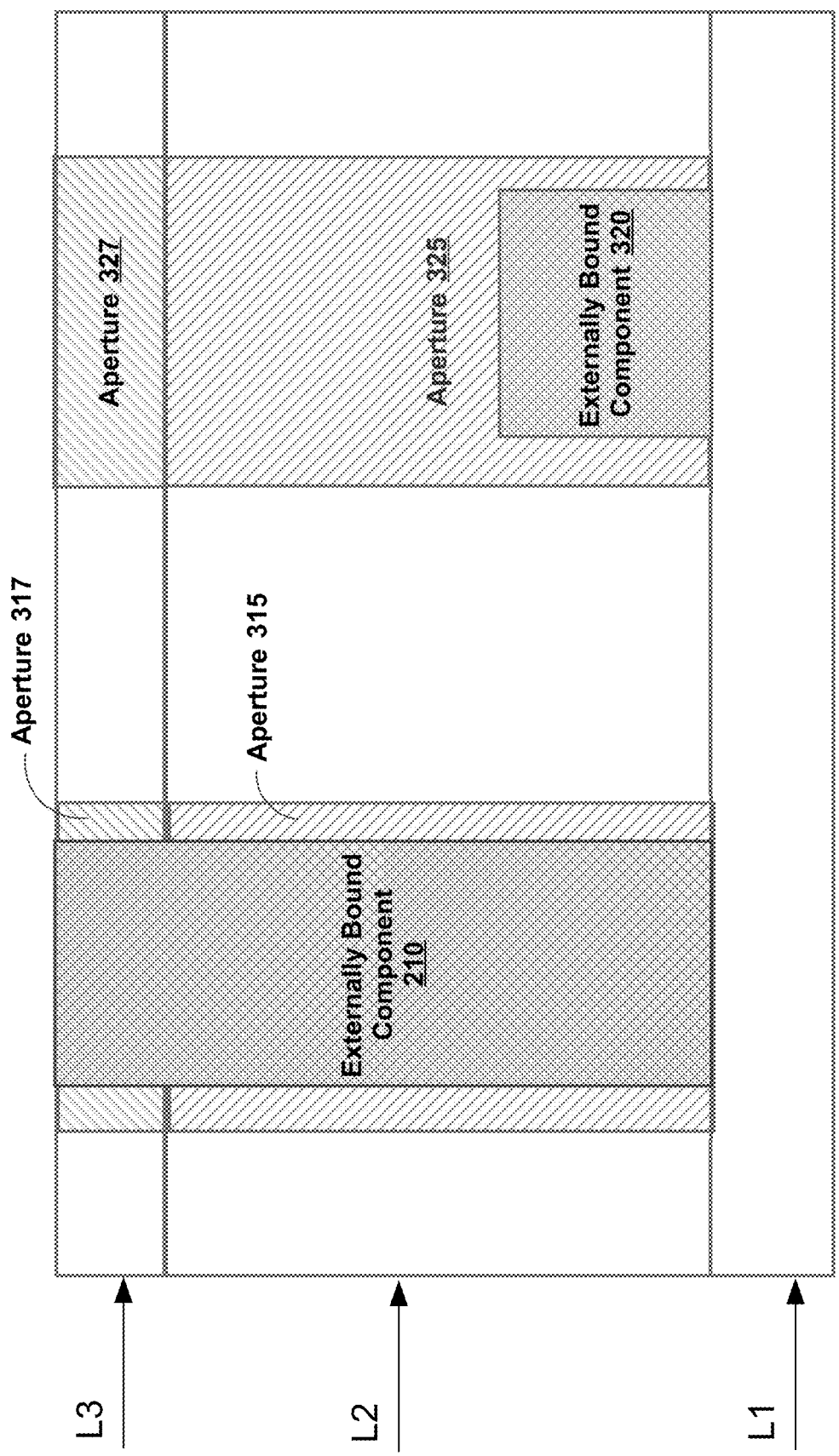
FIG. 3A is a block diagram that depicts a flexible PCB circuit with a single pair of circuit and spacer layers, in an embodiment.

FIG. 3A is a block diagram that depicts a flexible PCB circuit with a single pair of circuit and spacer layers, in an embodiment. Externally bound components 210 and 320 are integrated onto the same circuit layer, layer L1. Component 210 has a greater height than component 320. Layer L2 is a spacer layer that is placed based on the greater height of component 210, which is fitted through apertures 315 and 317, arranged, so component 210's surface is aligned with the top of interface layer L3. Component 320 has a lower height than component 210. Accordingly, component 320 does not reach the edge of interface layer L3 within its apertures 325 and 327 of respective layers L2 and L3. Therefore, component 320 may have degraded performance.

To further improve the performance of lower height externally bound component(s) integrated on the same flexible PCB, multiple pairs of circuit and spacer layers are used. An externally bound component with a greater height may be integrated on a lower circuit layer. In comparison, an externally bound component with a lower height may be integrated on a higher circuit layer. Thus, the externally bound component with a lower height can be externally exposed at the same time as the externally bound component with a greater height.

Figure 3B:
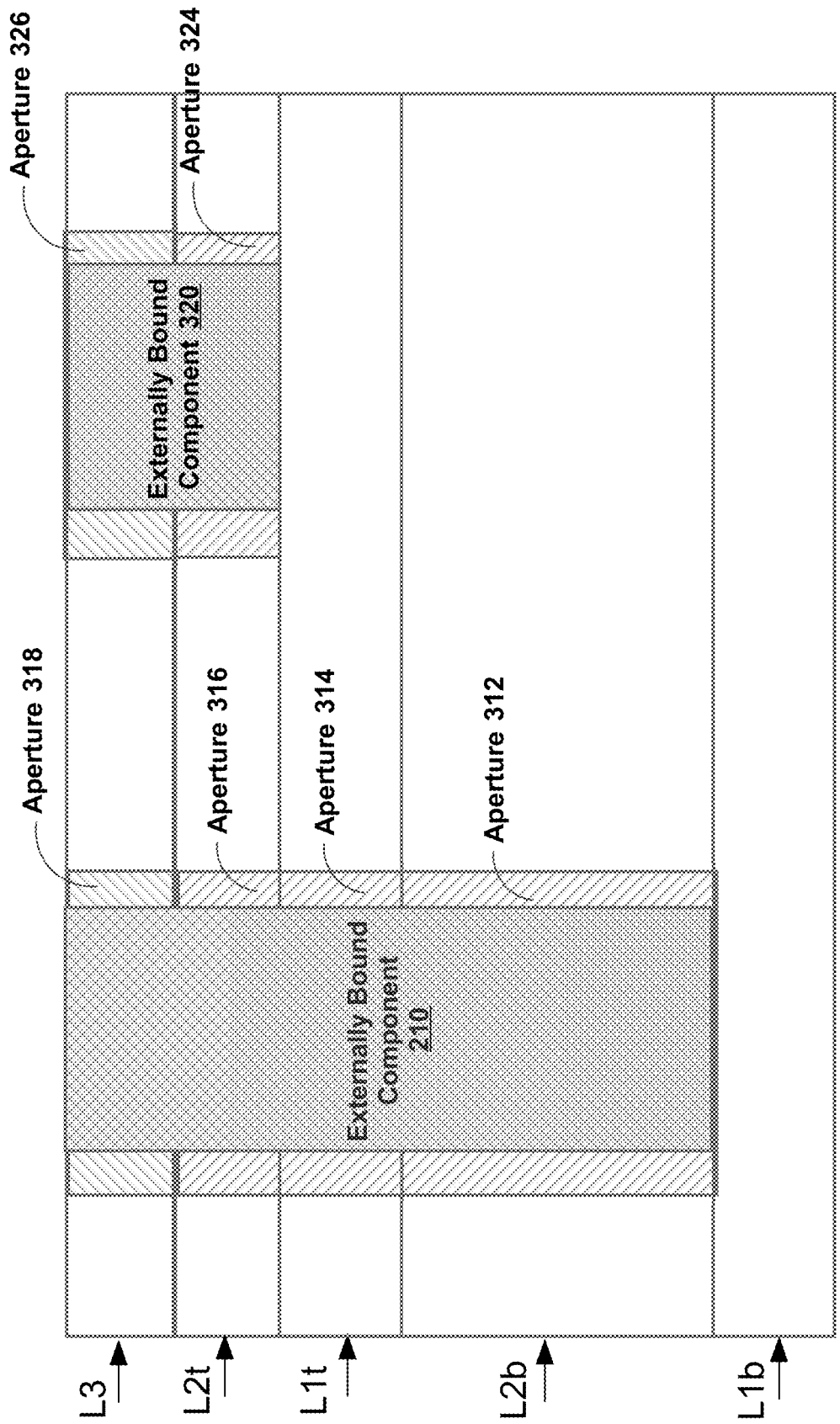
FIG. 3B is a block diagram that depicts a flexible PCB circuit with multiple pairs of circuit and spacer layers, in an embodiment.

FIG. 3B is a block diagram that depicts a flexible PCB circuit with multiple pairs of circuit and spacer layers, in an embodiment. The flexible PCB circuit contains two circuit layers bottom circuit layer L1$b$ on which externally bound component 210 is integrated, and top circuit layer L1$t$ on which externally bound component 320 is integrated. Spacer layer L2$b$ is placed with a particular height in such a way that it would ensure that component 320 reaches the surface of interface layer L3 and thus is exposed to the external environment for an optimal performance.

Figure 4:
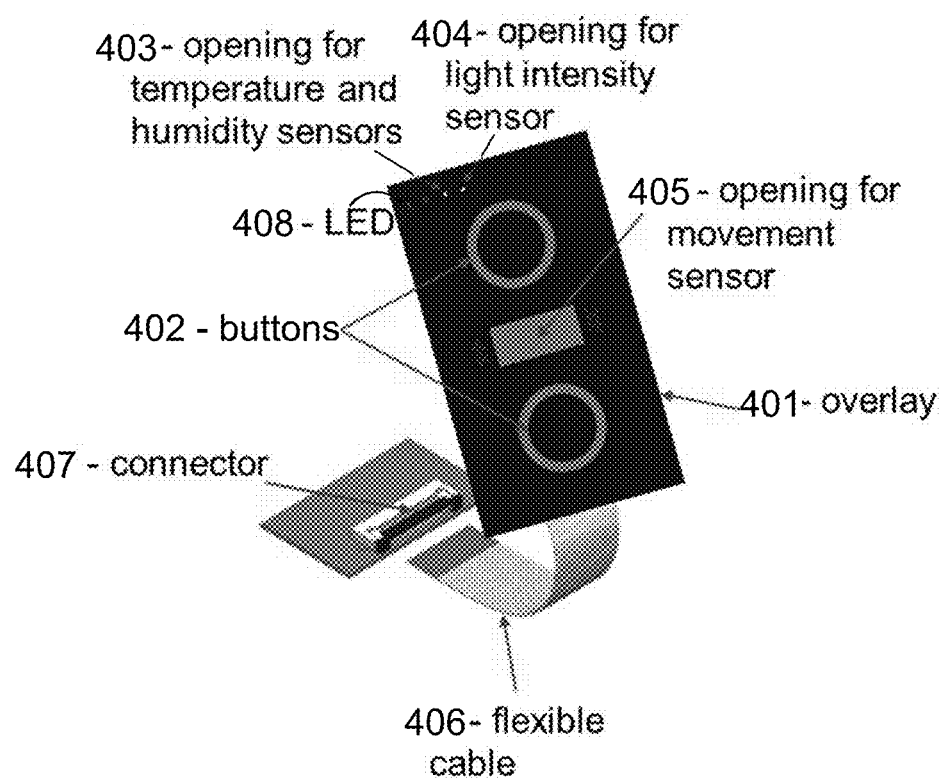
FIG. 4 depicts the interface layer of a flexible PCB circuit, in an embodiment.

FIG. 4 depicts the interface layer of a flexible PCB circuit, in an embodiment. Interface layer 401 of the flexible PCB may include an electro-mechanical interface such as buttons 402. The buttons may control a switch, such as an electrical wall-switch that controls the load(s). Interface components such as buttons 402 are electrically coupled to the circuit layer of the flexible PCB. The interface may further contain multiple openings, also referred herein to as apertures.

Interface layer 401 has apertures 403, 404, and 405 extending through the layer. Apertures 403, 404, and 405 are made for the respective integrated sensors to be exposed to the environment. Accordingly, the light intensity sensor surface is exposed through aperture 404 to detect light intensity even from acute angles. Aperture 403 exposes the surface of a temperature and humidity sensor for greater accuracy without any effect by the ambient heat of the device within the enclosure. Aperture 405 exposes a similarly integrated motion sensor. The movement sensor may protrude from the exterior surface of interface layer 401 to detect motion in any direction. Interface layer 401 may expose the flexible circuit's interface components such as light-emitting diode (LED) indicator 408 and buttons 402 through an aperture extending through the layer or by making the layer transparent at the locations of the interface components. The flexible PCB circuit is electrically coupled to the main rigid PCB circuit through flexible cable 406. Flexible cable electrically couples to connector 407 of the main rigid PCB circuit placed within the device's enclosure.

In an embodiment, the device with a flexible PCB, having externally bound components and arranged according to the techniques described herein, is a wall switch. The exterior of the wall switch is at least in part the interface layer of a flexible PCB. Electro-mechanical interface(s), such as buttons, LEDs, and programmable (touch-sensitive) displays, may be integrated onto the interface layer while being electrically coupled to a circuit layer of the PCB. The electrical supply that supplies the wall switch with electricity may be used to power the one or more PCB (flexible and/or non-flexible) circuits, removing any need for a battery-based source. The exposure of the externally bound components (e.g., sensors, antennas) to the external environment by placing the flexible PCB circuit on the device's exterior upgrades a regular wall switch into an accurate IoT sensor device.

Figure 5:
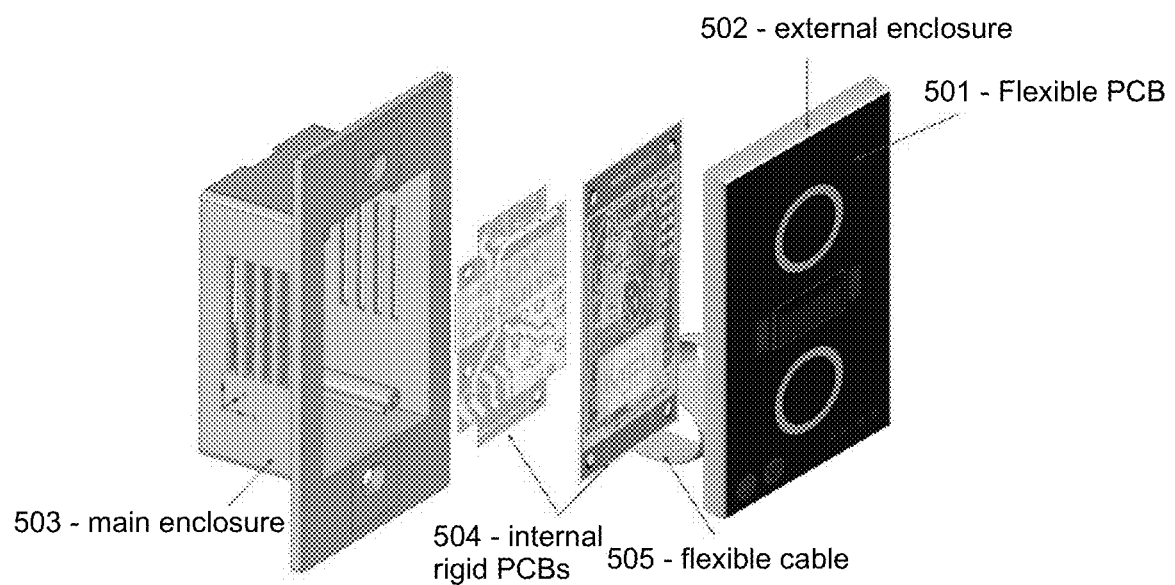
FIG. 5 depicts a wall switch with a flexible PCB exterior, in an embodiment.

FIG. 5 depicts a wall switch with a flexible PCB exterior, in an embodiment. Flexible PCB 501 contains integrated externally bound component(s) and an interface layer. Flexible PCB 501 is attached/affixed to external enclosure 502 of the device. Main enclosure 503 may contain one or more other PCB circuits, such as PCBs 504 inside main enclosure 503. One such PCB circuit may contain a relay circuitry to control the switch for turning on or off the load(s) controlled by the wall switch. Another internal PCB circuitry may contain a computer system that processes (interface, sensor, communication, etc.) inputs to control the switch(es) for the loads and to provide information to remote computer system(s) as well as to process inputs from the remote computer system(s) to control the wall switch. Flexible cable 505 connects flexible PCB 501 to internal PCBs 504 inside the enclosure.

Figure 6:
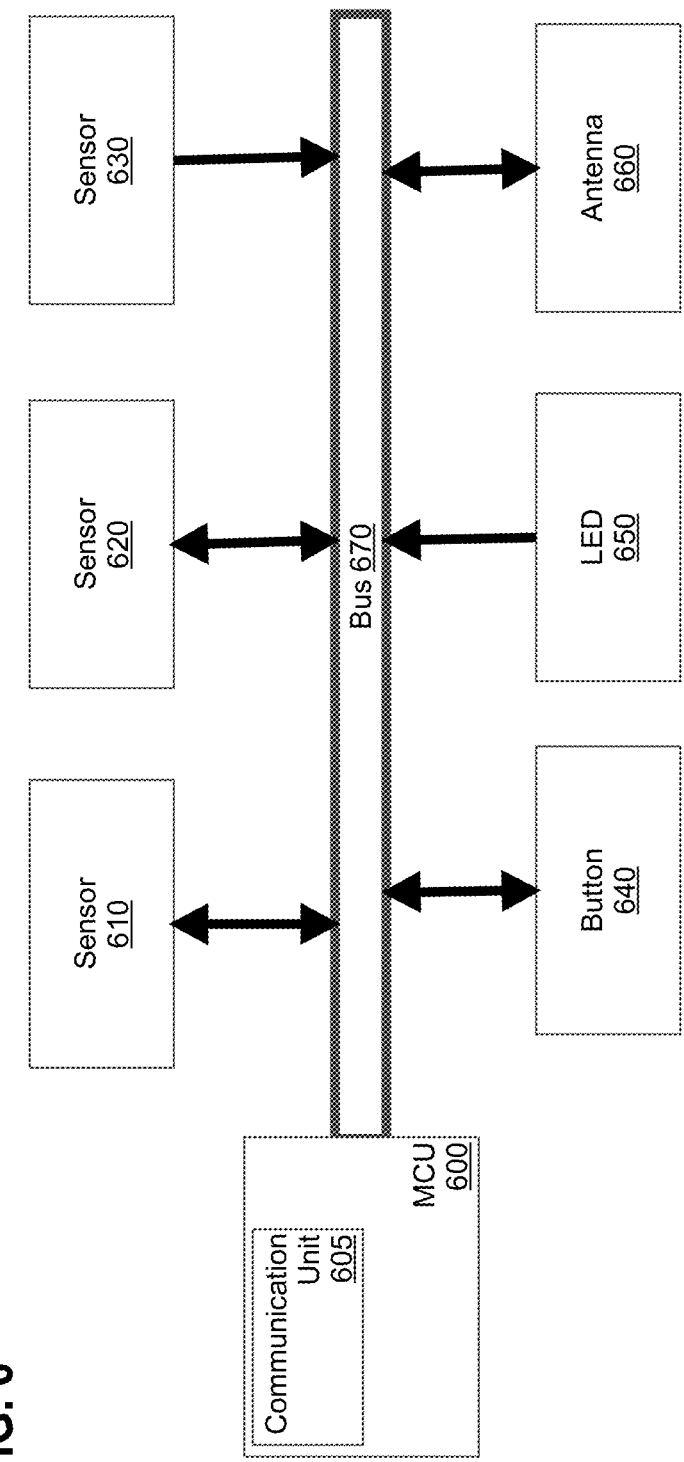
FIG. 6 is a block diagram that depicts an example system with an MCU connected externally bound components, in an embodiment.

FIG. 6 is a block diagram that depicts an example system with an MCU connected externally bound components, in an embodiment. The system may include, as an example, sensors 610/620/630, antenna 660, button 640, and LED indicator 650 connected through a signal bus 670 with MCU 600. MCU 600 may be located on the main (rigid) PCB that is internal to the enclosure (as shown in FIG. 5), whereas externally bound components, such as sensors 610/620/630, antenna 660 button 640, and LED 650, may be integrated into the flexible PCB on the external side of the enclosure (as shown in FIG. 4). Signals from the externally bound components are transmitted between MCU 600 through the flexible cable such as bus 670. In an embodiment, sensor 610 may be a combined temperature and humidity sensor; sensor 620 may be a light intensity sensor, sensor 630 may be a movement detection sensor. Any other combination of sensors or any other additional sensors (such as air quality sensor, sound level sensor, microphone, etc.) may be integrated into the flexible PCB on the external side of the enclosure or placed on the rigid PCB inside the enclosure.

Antenna 660 may be a wireless antenna for communication with external computer systems. The signals from antenna 660 are transmitted through bus 670 to MCU 600. MCU 600 may include communication unit 605 to process signals and communicate signals back to antenna 660 to transmit. Alternatively, both MCU including the communication unit 605 and antenna 660 may be integrated into the flexible PCB on the external side of the enclosure (we probably should put a number on antenna as well on FIG. 1B). In the case when the communication unit is separate from the MCU, we could place the MCU on the rigid board inside the enclosure and integrate the communication unit together with the antenna in the flexible PCB.

In an embodiment, sensor 610 and sensor 620 communicate with MCU 600 through I2C protocol, while sensor 630 is unidirectionally transmitting signals to the MCU when movement is detected. Using I2C protocol, reliable data transfer may occur between MCU 600 and sensors 610/620 by utilizing only two signal lines in bus 670. One of the lines is for I2C clock (SCK), and the other line is for I2C data (SDA). SCK and SDA may be common between sensor 610 and sensor 620. The sensor communication protocol may extend the connection to more sensors to the same two lines as long as I2C specification requirements are met, thus maintaining the compactness of the signal bus. Button 640 may be used to reset the MCU by sending a pulse signal indicating a reset request to MCU 600 when pressed. LED 650 is used to indicate the state of the system and is driven by MCU 600.

In an embodiment, MCU 600 has an integrated communication unit, such as a wireless module, that may be used to send sensor readings through antenna 660 to the cloud (remote computer systems), control the threshold values of sensors 610/620/630 as well as perform over-the-air (OTA) updates of the firmware of MCU 600.

After power-up, MCU 600 identifies sensors 610/620/630 that are connected to MCU 600. MCU 600 programs the configuration registers of sensors 610/620/630 and periodically takes the sensor readings. Part of configuration may include interrupting programming, which means sensors 610/620/630 automatically send an interrupt signal when a sensor reading exceeds a threshold value that has been programmed by MCU 600. The interrupt signal is not part of the I2C protocol and may be routed as a separate signal on bus 670. Alternatively, MCU 600 may monitor the sensor readings periodically and detect the threshold condition according to a custom-developed algorithm, thus avoiding a need for the interrupt signal.

In an embodiment, dummy signal lines on bus 670 are connected to MCU 600 but are left open on the flexible PCB. Using dummy signal lines, additional new externally bound components may be added on the flexible PCB avoiding the need to modify the mainboard, the flexible cable, and the main enclosure of the device. The usage of the I2C protocol further simplifies the task by allowing to re-use the existing I2C lines in order to connect more sensors on the flexible PCB. MCU 600 may update the firmware over the network, e.g., wirelessly, as MCU 600 supports OTA firmware updates.

What is claimed is:

1. An electronic device comprising:
an enclosure, the enclosure having a top surface;
a flexible printed circuit board (PCB) coupled to the top surface of the enclosure thereby placed outside of the enclosure;
one or more externally bound components integrated onto the flexible PCB;
the flexible PCB having a plurality of layers;

the plurality of layers of the flexible PCB including an interface layer and a spacer layer;

the spacer layer having one or more apertures extending through the spacer layer at one or more locations corresponding to the one or more externally bound components thereby exposing surfaces of the one or more externally bound components;

wherein the device is a wall-switch;

wherein the interface layer integrates an electro-mechanical user interface coupled to a circuit layer of the plurality of layers of the flexible PCB, the electro-mechanical user interface controlling one or more loads of the wall-switch.

2. The device of claim 1, wherein the flexible PCB is electrically coupled with a circuit within the enclosure, the circuit having a micro-controller unit, which is coupled to the one or more externally bound components.

3. The device of claim 1, wherein the flexible PCB integrates a micro-controller unit, which is electrically coupled to the one or more externally bound components.

4. The device of claim 1, wherein a height of an aperture of the one or more apertures is no greater than the height of a highest external bound component of the one or more externally bound components.

5. The device of claim 1,
wherein at least one externally bound component, of the one or more externally bound components, is integrated on the circuit layer of the plurality of layers of the flexible PCB;
wherein the spacer layer has an aperture extending through the spacer layer at a location of the at least one externally bound component;
wherein the interface layer has an aperture extending through the interface layer at the location of the at least one externally bound component.

6. The device of claim 1,
wherein at least one externally bound component, of the one or more externally bound components, is integrated on the circuit layer of the plurality of layers of the flexible PCB;
wherein the spacer layer has an aperture extending through the spacer layer at a location of the at least one externally bound component and is covered by the interface layer.

7. The device of claim 1, wherein at least one externally bound component, of the one or more externally bound components, is integrated on the circuit layer of the plurality of layers of the flexible PCB and is covered by the spacer layer and the interface layer.

8. The device of claim 1,
wherein the spacer layer is a first spacer layer and corresponds to a first circuit layer of the plurality of layers of the flexible PCB;
wherein a first externally bound component, of the one or more externally bound components, has a greater height than a second externally bound component, of the one or more externally bound components;
wherein the first externally bound component is integrated onto the first circuit layer having the first spacer layer;
wherein the second externally bound component is integrated on a second circuit layer, of the plurality of layers, having a second spacer layer;
wherein the first circuit layer and the first spacer layer are arranged below the second circuit layer and the second spacer layer, thereby having the first externally bound component and the second externally bound component the same exposure at the interface layer of the flexible PCB.

9. The device of claim 1, wherein the one or more externally bound components include a sensor component.

10. The device of claim 1, wherein the one or more externally bound components include an antenna.

* * * * *